United States Patent
Kashiwaya et al.

(10) Patent No.: US 7,176,155 B2
(45) Date of Patent: Feb. 13, 2007

(54) PIEZOELECTRIC/ELECTROSTRICTIVE CERAMIC COMPOSITION, PIEZOELECTRIC/ELECTROSRICTIVE MATERIAL, AND PIEZOELECTRIC/ELECTROSTRICTIVE FILM DEVICE

(75) Inventors: Toshikatsu Kashiwaya, Inazawa (JP); Hideki Shimizu, Ohbu (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 118 days.

(21) Appl. No.: 11/001,952

(22) Filed: Dec. 2, 2004

(65) Prior Publication Data
US 2005/0153827 A1    Jul. 14, 2005

(30) Foreign Application Priority Data
Dec. 8, 2003    (JP)    ............................. 2003-408826

(51) Int. Cl.
*H01L 41/04*    (2006.01)
*C04B 35/493*    (2006.01)

(52) U.S. Cl. .............................. 501/134; 252/62.9 PZ; 310/311; 310/358

(58) Field of Classification Search ......... 252/62.9 PZ; 310/330, 311, 358; 501/134
See application file for complete search history.

(56) References Cited

U.S. PATENT DOCUMENTS 6,565,997 B2 *    5/2003    Kashiwaya ................. 428/701
6,713,123 B2 *    3/2004    Kashiwaya et al. ......... 427/100
7,019,441 B2 *    3/2006    Kashiwaya ................. 310/330
2004/0051422 A1    3/2004    Kashiwaya et al.

FOREIGN PATENT DOCUMENTS

| JP | 50-03519 | 2/1975 |
| JP | 60-102779 | 6/1985 |
| JP | 42-20029 | 8/1992 |
| JP | 07-315926 | 12/1995 |
| JP | 11-029357 | 2/1999 |
| JP | 2002-100819 | 4/2002 |
| JP | 2002-217464 | 8/2002 |
| JP | 2002-217465 | 8/2002 |
| JP | 2004-304018 | 10/2004 |

OTHER PUBLICATIONS

U.S. Appl. No. 10/797,991, filed Mar. 11, 2004, Kashiwaya, Toshikatsu.

* cited by examiner

*Primary Examiner*—Karl Group
(74) *Attorney, Agent, or Firm*—Burr & Brown

(57) ABSTRACT

A piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$. The piezoelectric/electrostrictive ceramic composition can constitute a piezoelectric/electrostrictive body or a piezoelectric/electrostrictive portion both having an excellent piezoelectric/electrostrictive property and durability even under high-temperature and highly humid conditions.

18 Claims, 6 Drawing Sheets

PIEZOELECTRIC/ELECTROSTRICTIVE CERAMIC COMPOSITION, PIEZOELECTRIC/ELECTROSRICTIVE MATERIAL, AND PIEZOELECTRIC/ELECTROSTRICTIVE FILM DEVICE

This application claims the benefit of Japanese Application 2003-408826, filed Dec. 8, 2003, the entirety of which is incorporated herein by reference.

BACKGROUND OF THE INVENTION AND RELATED ART STATEMENT

The present invention relates to a piezoelectric/electrostrictive ceramic composition, a piezoelectric/electrostrictive body, and a piezoelectric/electrostrictive film device. More particularly, the present invention relates to a piezoelectric/electrostrictive ceramic composition capable of constituting a piezoelectric/electrostrictive body or a piezoelectric/electrostrictive portion both having an excellent piezoelectric/electrostrictive property and durability even under high-temperature and highly humid conditions; a piezoelectric/electrostrictive body having an excellent piezoelectric/electrostrictive property and durability even under high-temperature and highly humid conditions; and a piezoelectric/electrostrictive film device comprising, a piezoelectric/electrostrictive portion having an excellent piezoelectric/electrostrictive property and durability even under high-temperature and highly humid conditions.

As an device capable of controlling a very fine displacement in a submicron order, piezoelectric/electrostrictive film devices have been known. In particular, a piezoelectric/electrostrictive device formed by laminating, on a substrate made of a ceramic, a piezoelectric/electrostrictive portion made of a piezoelectric/electrostrictive ceramic composition and electrode portions to which a voltage is applied, is suitable for control of a very fine displacement and moreover has superior properties such as high electromechanical transduction efficiency, high-speed response, high durability, low power consumption and the like. Therefore, the piezoelectric/electrostrictive device is in use in various applications such as piezoelectric pressure sensor, probe-transferring mechanism in scanning tunneling microscope, rectilinear guide mechanism in ultra-precision processing apparatus, servo valve for hydraulic system, head of VTR, picture device constituting flat panel type image display, head of ink jet printer, and the like.

Meanwhile, various investigations have been made on the piezoelectric/electrostrictive ceramic composition constituting the piezoelectric/electrostrictive portion of piezoelectric/electrostrictive film device. There is disclosed, for example, a $Pb(Mg_{1/3}Nb_{2/3})O_3$—$PbTiO_3$—$PbZrO_3$ ternary solid solution system composition, or a piezoelectric/electrostrictive ceramic composition wherein, in the above ternary composition, part of Pb is substituted with Sr, La or the like (reference is made to, for example, JP-B-44-17103 and JP-B-45-8145). Such a composition is expected to be able to constitute, in a piezoelectric/electrostrictive device, a piezoelectric/electrostrictive portion (which is the most important portion of the device and determines the piezoelectric property of the device) superior in piezoelectric property (e.g. piezoelectric d constant).

Conventional piezoelectric/electrostrictive devices have had a problem in that, when placed or used in severe conditions such as high-temperature (35° C. or higher) condition, highly humid (80% RH or higher) condition, and the like, they tend to show a reduction in flexural displacement. Further, when they are placed or used in such severe conditions and, for example, a high electric field is applied, they generate, in some cases, micro-cracks in the piezoelectric/electrostrictive portion. Therefore, particularly when they undergo repeated flexural displacement a large number of times, their durability tends to decrease rapidly and there has been a problem in that their initial piezoelectric/electrostrictive property can not be exhibited.

Piezoelectric/electrostrictive devices are considered to be placed in various environments and used repeatedly, depending upon the applications. For example, when used as a sensor, they may be placed in, for example, the outdoors where no air-conditioner or the like is installed. Hence, it is desired to develop a piezoelectric/electrostrictive body and a piezoelectric/electrostrictive device both having sufficient durability even when placed and used under relatively severe conditions.

SUMMARY OF THE INVENTION

The present invention has been made in view of the above problems of prior art. The object of the present invention is to provide a piezoelectric/electrostrictive ceramic composition capable of constituting a piezoelectric/electrostrictive body or a piezoelectric/electrostrictive portion both having an excellent piezoelectric/electrostrictive property and durability even under high-temperature and highly humid conditions; a piezoelectric/electrostrictive body having an excellent piezoelectric/electrostrictive property and durability even under high-temperature and highly humid conditions; and a piezoelectric/electrostrictive film device comprising a piezoelectric/electrostrictive portion having an excellent piezoelectric/electrostrictive property and durability even under high-temperature and highly humid conditions.

The present inventors made an intensive study in order to attain the above object. As a result, the present inventors have found, as a new finding, that the above object can be attained by allowing a piezoelectric/electrostrictive ceramic composition for constituting a piezoelectric/electrostrictive body or a piezoelectric/electrostrictive portion, to contain Si in a very small quantity. The present invention has been completed based on the above finding. According to the present invention, there are provided the following piezoelectric/electrostrictive ceramic composition, piezoelectric/electrostrictive body, and piezoelectric/electrostrictive film device.

[1] A piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$ (hereinafter, this composition is expressed, in some cases, as "the first piezoelectric/electrostrictive ceramic composition").

[2] A piezoelectric/electrostrictive ceramic composition according to the above [1], wherein the $Pb(Mg_{1/3}Nb_{2/3})O_3$—$PbTiO_3$—$PbZrO_3$ ternary solid solution system composition is presented by the following compositional formula (1):

$$Pb_x(Mg_{y/3}Nb_{2/3})_a Ti_b Zr_c O_3 \tag{1}$$

wherein x is $0.95 \leq x \leq 1.05$; y is $0.8 \leq y \leq 1.0$; a, b and c are decimals defined by the range, in coordinates formed by three coordinate axes of a, b and c, a range of (a,b,c)=(0.550, 0.425, 0.025), (0.550, 0.325, 0.125), (0.375, 0.325, 0.300), (0.100, 0.425, 0.475), (0.100, 0.525, 0.375) and (0.375, 0.425, 0.200); and a+b+c=1.000.

[3] A piezoelectric/electrostrictive ceramic composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$ (hereinafter, this composition is expressed, in some cases, as "the second piezoelectric/electrostrictive ceramic composition").

[4] A piezoelectric/electrostrictive ceramic composition according to the above [3], wherein the $Pb(Mg,Ni)_{1/3}Nb_{2/3}O_3$—$PbTiO_3$-$PbZrO_3$ ternary solid solution system composition is presented by the following compositional formula (2):

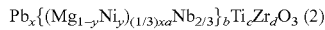

wherein x is $0.95 \leq x \leq 1.05$; y is $0.05 \leq y \leq 0.20$; a is $0.90 \leq a \leq 1.10$; b, c and d are decimals defined by the range, in coordinates formed by three coordinate axes of b, c and d, a range of (b,c,d)=(0.550, 0.425, 0.025), (0.550, 0.325, 0.125), (0.375, 0.325, 0.300), (0.100, 0.425, 0.475), (0.100, 0.525, 0.375) and (0.375, 0.425, 0.200); and b+c+d=1.000.

[5] A piezoelectric/electrostrictive body made of crystal grains constituted by a piezoelectric/electrostrictive ceramic composition set forth in the above [1] or [2] (hereinafter, this body is expressed, in some cases, as "the first piezoelectric/electrostrictive body").

[6] A piezoelectric/electrostrictive body according to the above [5], wherein the crystal grains have an average particle diameter of 0.5 to 5 μm.

[7] A piezoelectric/electrostrictive body made of crystal grains constituted by a piezoelectric/electrostrictive ceramic composition set forth in the above [3] or [4] (hereinafter, this body is expressed, in some cases, as "the second piezoelectric/electrostrictive body").

[8] A piezoelectric/electrostrictive body according to the above [7], wherein the crystal grains have an average particle diameter of 0.5 to 5 μm.

[9] A piezoelectric/electrostrictive film device comprising a substrate made of a ceramic, at least one piezoelectric/electrostrictive portion and a plural electrode layers electrically connected to the piezoelectric/electrostrictive portion, wherein said at least one piezoelectric/electrostrictive portion is solidly bonded to the substrate directly or via one of the electrode layers, characterized in that the piezoelectric/electrostrictive portion is made of crystal grains constituted by a piezoelectric/electrostrictive ceramic composition set forth in the above [1] or [2] (hereinafter, this device is referred to, in some cases, as "the first piezoelectric/electrostrictive film device").

[10] A piezoelectric/electrostrictive film device according to the above [9], wherein the crystal grains have an average particle diameter of 0.5 to 5 μm.

[11] A piezoelectric/electrostrictive film device according to the above [9] or [10], wherein a plural number of the piezoelectric/electrostrictive portions and the electrode layers are provided and a plurality of the piezoelectric/electrostrictive portions and a plurality of the electrodes are laminated alternately by sandwiching them each other.

[12] A piezoelectric/electrostrictive film device according to any of the above [9] to [11], wherein each piezoelectric/electrostrictive portion has a thickness of 0.5 to 50 μm.

A piezoelectric/electrostrictive film device comprising a substrate made of a ceramic, a piezoelectric/electrostrictive portion and electrode layers electrically connected to the piezoelectric/electrostrictive portion, wherein the piezoelectric/electrostrictive portion is solidly bonded to the substrate directly or via one of the electrode layers, characterized in that the piezoelectric/electrostrictive portion is made of crystal grains constituted by a piezoelectric/electrostrictive ceramic composition set forth in the above [3] or [4] (hereinafter, this device is referred to, in some cases, as "the second piezoelectric/electrostrictive film device").

[14] A piezoelectric/electrostrictive film device according to the above [13], wherein the crystal grains have an average particle diameter of 0.5 to 5 μm.

[15] A piezoelectric/electrostrictive film device according to the above [13] or [14], wherein a plural number of the piezoelectric/electrostrictive portions and the electrode layers are provided and a plurality of the piezoelectric/electrostrictive portions and a plurality of the electrode layers are laminated alternately by sandwiching them each other.

[16] A piezoelectric/electrostrictive film device according to any of the above [13] to [15], wherein each piezoelectric/electrostrictive portion has a thickness of 0.5 to 50 μm.

[17] A piezoelectric/electrostrictive film device comprising a substrate made of a ceramic, a plurality of piezoelectric/electrostrictive portions made of a piezoelectric/electrostrictive ceramic composition, and a plurality of electrode layers electrically connected to the piezoelectric/electrostrictive portions, wherein the piezoelectric/electrostrictive portions and the electrode layers are laminated alternately on the substrate and the lowermost piezoelectric/electrostrictive portion is solidly bonded to the substrate directly or via the lowermost electrode layer, characterized in that at least one piezoelectric/electrostrictive portion (first piezoelectric/electrostrictive portion) is constituted by a piezoelectric/electrostrictive ceramic composition set forth in the above [1] or [2] and at least one piezoelectric/electrostrictive portion (second piezoelectric/electrostrictive portion) other than the first piezoelectric/electrostrictive portion is constituted by a piezoelectric/electrostrictive ceramic composition set forth in the above [3] or [4] (hereinafter, this device is referred to, in some cases, as "the third piezoelectric/electrostrictive film device").

[18] A piezoelectric/electrostrictive film device according to the above [17], wherein the plurality of piezoelectric/electrostrictive portions have each a thickness of 0.5 to 50 μm.

[19] A piezoelectric/electrostrictive film device according to the above [17] or [18], wherein a Ni content in terms of NiO, of the piezoelectric/electrostrictive ceramic composition constituting the lowermost piezoelectric/electrostrictive portion is smaller than the Ni content in terms of NiO, of the piezoelectric/electrostrictive ceramic composition constituting the piezoelectric/electrostrictive portion other than the lowermost piezoelectric/electrostrictive portion.

The piezoelectric/electrostrictive ceramic composition of the present invention is a composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$, or a composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$; thereby, the composition can be used to constitute a piezoelectric/electrostrictive body or a piezoelectric/electrostrictive portion both having an excellent piezoelectric/electrostrictive property and durability even under high-temperature and highly humid conditions.

The piezoelectric/electrostrictive body of the present invention is made of crystal grains constituted by the above piezoelectric/electrostrictive ceramic composition; therefore, the body has an excellent piezoelectric/electrostrictive property and durability even under high-temperature and highly humid conditions.

The piezoelectric/electrostrictive film device of the present invention comprises a piezoelectric/electrostrictive portion made of crystal grains constituted by either of the above piezoelectric/electrostrictive ceramic compositions; therefore, they have an excellent piezoelectric/electrostrictive property and durability even under high-temperature and highly humid conditions.

BRIEF DESCRIPTION OF THE DRAWINGS

FIG. 5($b$) is a sectional view schematically showing still other embodiment of the piezoelectric/electrostrictive film device of the present invention.

FIG. 12($b$) is a top view of the embodiment shown in FIG. 6.

In FIGS. 1 to 12, the following numerals and symbols each denote the following substrate, surface, portion, electrode, unit, device or width.

Figure 1:
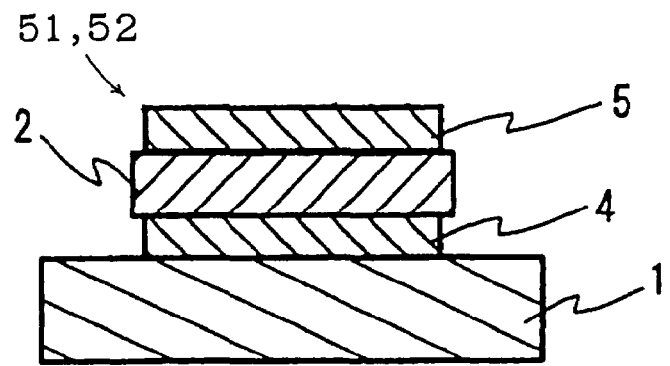
FIG. 1 is a sectional view schematically showing an embodiment of the piezoelectric/electrostrictive film device of the present invention.

1: substrate,
1$a$: surface of solid bonding,
1$b$: thick portion,
1$c$: thin portion,
2, 2$a$, 2$b$, 2$c$, 3, 3$a$, 3$b$, 3$c$: piezoelectric/electrostrictive portions,
4, 5, 6, 14, 16: electrodes,
10, 10$a$, 10$b$, 10$c$: piezoelectric/electrostrictive film device units,
12: first piezoelectric/electrostrictive portion,
13: second piezoelectric/electrostrictive portion,
15: lowermost piezoelectric/electrostrictive portion,
20: common substrate,
51: first piezoelectric/electrostrictive film device,
52: second piezoelectric/electrostrictive film device,
53: third piezoelectric/electrostrictive film device,
P: width of lower electrode,
Q: width of intermediate electrode,
R: width of upper electrode

PREFERRED EMBODIMENTS

Preferred embodiments of the present invention are described below. However, the present invention is not restricted to the following embodiments and it should be construed that as long as there is no deviation from the gist of the present invention, design change, modifications, etc. can be appropriately made based on the ordinary knowledge possessed by those skilled in the art. Incidentally, in the present specification, when there is merely mentioned "the piezoelectric/electrostrictive ceramic composition of the present invention", it denotes both of the first and second piezoelectric/electrostrictive ceramic compositions; when there is merely mentioned "the piezoelectric/electrostrictive body of the present invention", it denotes both of the first and second piezoelectric/electrostrictive body; and when there is merely mentioned "the piezoelectric/electrostrictive film device of the present invention", it denotes all of the first, second and third piezoelectric/electrostrictive film devices.

The embodiment of the first piezoelectric/electrostrictive ceramic composition of the present invention is a piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$. This piezoelectric/electrostrictive ceramic composition contains Ni in a given proportion in terms of NiO; therefore, when it is fired to produce a piezoelectric/electrostrictive portion, formation of heterogeneous phase in the portion can be suppressed, and there can be produced a piezoelectric/electrostrictive portion for compact, superior property piezoelectric/electrostrictive film device, wherein the proportion of perovskite phase contributing to electric field-induced strain is high and which is dense and very high in piezoelectric/electrostrictive property. The content of Ni in terms of NiO is preferably 0.10 to 2.5% by mass, more preferably 0.15 to 2.0% by mass from the standpoint of highly suppressing the formation of heterogeneous phase during firing. In the present invention, the term "the major component" in the description "containing, as a major component, a $Pb(Mg_{1/3}Nb_{2/3})O_3$—$PbTiO_3$—$PbZrO_3$ ternary solid solution system composition" means that the proportion of the $Pb(Mg_{1/3}Nb_{2/3})O_3$—$PbTiO_3$—$PbZrO_3$ ternary solid solution system composition to the total piezoelectric/electrostrictive ceramic composition excluding Ni and Si is 99.5% by mass or more, preferably 99.8% by mass or more.

The first piezoelectric/electrostrictive ceramic composition further contains Si in an amount of 0.003 to 0.01% by mass in terms of $SiO_2$. This Si is reactive with the Pb in the major component, i.e. the $Pb(Mg_{1/3}Nb_{2/3})O_3$—$PbTiO_3$—$PbZrO_3$ ternary solid solution system composition; therefore, when the ceramic composition is fired to produce a piezoelectric/electrostrictive body or a piezoelectric/electrostrictive portion, there is formed, on the resulting crystal grains of piezoelectric/electrostrictive nature, a thin and uniform liquid phase which later becomes a low-melting glass layer. This liquid phase formation promotes densification, whereby is obtained a piezoelectric/electrostrictive body or portion which is denser. Further, the low-melting glass layer makes small the difference in mass diffusion by site and enables the growth of uniform crystal grains; as a result, there is obtained a piezoelectric/electrostrictive body or a piezoelectric/electrostrictive portion both constituted by crystal grains having more uniform particle diameters.

A piezoelectric/electrostrictive body or a piezoelectric/electrostrictive device both produced by, for example, firing of a piezoelectric/electrostrictive ceramic composition shows a reduction in durability when used repeatedly under high-temperature and highly humid conditions. The reason for this reduction in durability is considered to be that a piezoelectric/electrostrictive body or a piezoelectric/electrostrictive portion generally has a large number of fine pores at the grain boundaries constituting the body or the portion and, when there is penetration of water through the fine pores, microcracks are generated. Since these microcracks grow along the grain boundaries, it is considered that, when the crystal grains have large particle diameters or there is a large fluctuation in the particle diameters of the crystal grains, the length of each-time growth of microcracks is large or there is a large fluctuation in the growth speed of microcracks.

However, when there is used the first piezoelectric/electrostrictive ceramic composition of the present invention, there can be produced a piezoelectric/electrostrictive body or a piezoelectric/electrostrictive portion both constituted by crystal grains having more uniform diameters. Therefore, there hardly take place penetration of water through fine pores and resultant generation of microcracks, and there can be obtained a piezoelectric/electrostrictive body or a piezoelectric/electrostrictive portion both having an excellent piezoelectric/electrostrictive property and durability even under high-temperature and highly humid conditions. Incidentally, from the standpoint of obtaining a piezoelectric/electrostrictive body or a piezoelectric/electrostrictive portion both having an excellent piezoelectric/electrostrictive property and durability even under high-temperature and highly humid conditions, the Si content (in terms of $SiO_2$) in the first piezoelectric/electrostrictive ceramic composition of the present invention is preferably 0.004 to 0.009% by mass, more preferably 0.005 to 0.008% by mass.

In the first piezoelectric/electrostrictive ceramic composition of the present invention, the $Pb(Mg_{1/3}Nb_{2/3})O_3$—$PbTiO_3$—$PbZrO_3$ ternary solid solution system composition is preferred to be presented by the following compositional formula (1), because there can be obtained therefrom a piezoelectric/electrostrictive body or a piezoelectric/electrostrictive portion both having a higher piezoelectric property:

$$Pb_x(Mg_{y/3}Nb_{2/3})_aTi_bZr_cO_3 \quad (1)$$

wherein x is $0.95 \leq x \leq 1.05$; y is $0.8 \leq y \leq 1.0$; a, b and c are decimals defined by the range, in coordinates formed by three coordinate axes of a, b and c, a range of (a,b,c)=(0.550, 0.425, 0.025), (0.550, 0.325, 0.125), (0.375, 0.325, 0.300), (0.100, 0.425, 0.475), (0.100, 0.525, 0.375) and (0.375, 0.425, 0.200); and a+b+c=1.000.

Next, the embodiment of the second piezoelectric/electrostrictive ceramic composition of the present invention is described. The embodiment of the second piezoelectric/electrostrictive ceramic composition of the present invention is a piezoelectric/electrostrictive ceramic composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$. The second piezoelectric/electrostrictive ceramic composition contains, as a major component, a $Pb(Mg,Ni)_{1/3}Nb_{2/3}O_3$—$PbTiO_3$—$PbZrO_3$ ternary solid solution system composition wherein part of Mg is substituted with Ni; therefore, when it is fired to produce a piezoelectric/electrostrictive portion, formation of heterogeneous phase in the portion can be suppressed, and there can be produced a piezoelectric/electrostrictive portion for compact, superior property piezoelectric/electrostrictive film device, wherein the proportion of perovskite phase contributing to electric field-induced strain is high and which is dense and very high in piezoelectric/electrostrictive property.

The second piezoelectric/electrostrictive ceramic composition further contains Si in an amount of 0.003 to 0.01% by mass in terms of $SiO_2$; therefore, as in the embodiment of the first piezoelectric/electrostrictive ceramic composition, a denser piezoelectric/electrostrictive body or portion can be produced and there can be obtained a piezoelectric/electrostrictive body or portion constituted by crystal grains having more uniform particle diameters. In the present specification, the term "the major component" in the description "containing, as a major component, a $Pb(Mg,Ni)_{1/3}Nb_{2/3}O_3$—$PbTiO_3$—$PbZrO_3$ ternary solid solution system composition" means that the proportion of the $Pb(Mg,Ni)_{1/3}Nb_{2/3}O_3$—$PbTiO_3$—$PbZrO_3$ ternary solid solution system composition to the total piezoelectric/electrostrictive ceramic composition excluding Si is 99.5% by mass or more, preferably 99.8% by mass or more.

Owing to the presence of a given proportion of Si, the second piezoelectric/electrostrictive ceramic composition makes it possible, as in the first piezoelectric/electrostrictive ceramic composition, to obtain a piezoelectric/electrostrictive body or a piezoelectric/electrostrictive portion both having an excellent piezoelectric/electrostrictive property and durability even under high-temperature and highly humid conditions. Incidentally, from the standpoint of obtaining a piezoelectric/electrostrictive body or a piezoelectric/electrostrictive portion both having an even more excellent piezoelectric/electrostrictive property and durability even under high-temperature and highly humid conditions, the Si content (in terms of $SiO_2$) in the second piezoelectric/electrostrictive ceramic composition is preferably 0.004 to 0.009% by mass, more preferably 0.005 to 0.008% by mass.

In the second piezoelectric/electrostrictive ceramic composition, the $Pb(Mg,Ni)_{1/3}Nb_{2/3}O_3$—$PbTiO_3$—$PbZrO_3$ ternary solid solution system composition is preferred to be presented by the following compositional formula (2), because there can be obtained therefrom a piezoelectric/electrostrictive body or a piezoelectric/electrostrictive portion both having a higher piezoelectric property:

$$Pb_x\{(Mg_{1-y}Ni_y)_{(1/3)xa}Nb_{2/3}\}_bTi_cZr_dO_3 \quad (2)$$

wherein x is $0.95 \leq x \leq 1.05$; y is $0.05 \leq y \leq 0.20$; a is $0.90 \leq a \leq 1.10$; b, c and d are decimals defined by the range, in coordinates formed by three coordinate axes of b, c and d, a range of (b,c,d)=(0.550, 0.425, 0.025), (0.550, 0.325, 0.125), (0.375, 0.325, 0.300), (0.100, 0.425, 0.475), (0.100, 0.525, 0.375) and (0.375, 0.425, 0.200); and b+c+d=1.000.

Next, the first piezoelectric/electrostrictive body of the present invention is described. The embodiment of the first piezoelectric/electrostrictive body is a piezoelectric/electrostrictive body (a so-called bulk body) made of crystal grains constituted by the above-mentioned first piezoelectric/electrostrictive ceramic composition, i.e. a piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$. As described above, since the first piezoelectric/electrostrictive ceramic composition contains Ni in a given proportion in terms of NiO, the first piezoelectric/electrostrictive body of the present embodiment which is constituted by the composition and is specifically made of crystal grains formed by, for example, firing of the composition, is very low in proportion of heterogeneous phase and high in proportion of the perovskite phase contributing to electric field-induced strain and is dense and extremely high in piezoelectric/electrostrictive property.

Further, since the first piezoelectric/electrostrictive ceramic composition contains Si in a given proportion in terms of $SiO_2$, the first piezoelectric/electrostrictive body of the present embodiment made of crystal grains formed by firing of the composition is denser, is constituted by crystal grains having uniform particle diameters, and has an excellent piezoelectric/electrostrictive property and durability even under high-temperature and highly humid conditions.

In the first piezoelectric/electrostrictive body, the crystal grains constituting the body have an average particle diameter of preferably 0.5 to 5 μm, more preferably 1 to 4 μm, particularly preferably 1.3 to 3.7 μm. When the average particle diameter is less than 0.5 μm, domains may not develop sufficiently in the piezoelectric/electrostrictive body; as a result, there arise, in some cases, a reduction in flexural displacement and a reduction in linearity of flexural displacement to electric field in high electric field region. Meanwhile, when the average particle diameter is more than 5 μm, domains develop sufficiently in the piezoelectric/electrostrictive body; however, the movement of large domains is insufficient, giving a small flexural displacement in some cases.

Next, the embodiment of the second piezoelectric/electrostrictive body is described. The embodiment of the second piezoelectric/electrostrictive body is a piezoelectric/electrostrictive body (a so-called bulk body) made of crystal grains constituted by the above-mentioned second piezoelectric/electrostrictive ceramic composition, that is, a piezoelectric/electrostrictive ceramic composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$. As described above, since the second piezoelectric/electrostrictive ceramic composition contains, as a major component, a $Pb(Mg,Ni)_{1/3}Nb_{2/3}O_3$—$PbTiO_3$—$PbZrO_3$ ternary solid solution system composition wherein part of Mg is substituted with Ni, the second piezoelectric/electrostrictive body of the present embodiment which is constituted by the composition and is specifically made of crystal grains formed by, for example, firing of the composition, is very low in proportion of heterogeneous phase and high in proportion of the perovskite phase contributing to electric field-induced strain and is dense and extremely high in piezoelectric/electrostrictive property.

Further, since the second piezoelectric/electrostrictive ceramic composition contains Si in a given proportion in terms of $SiO_2$, the second piezoelectric/electrostrictive body of the present embodiment made of crystal grains formed by firing of the composition is denser, is constituted by crystal grains having uniform particle diameters, and has an excellent piezoelectric/electrostrictive property and durability even under high-temperature and highly humid conditions.

In the second piezoelectric/electrostrictive body, the crystal grains constituting the body have an average particle diameter of preferably 0.5 to 5 μm, more preferably 1 to 4 μm, particularly preferably 1.3 to 3.7 μm. When the average diameter is less than 0.5 μm, domains may not develop sufficiently in the piezoelectric/electrostrictive body; as a result, there arise, in some cases, a reduction in flexural displacement and a reduction in linearity of flexural displacement to electric field in high electric field region. Meanwhile, when the average particle diameter is more than 5 μm, domains develop sufficiently in the piezoelectric/electrostrictive body; however, the movement of large domains is insufficient, giving a small flexural displacement in some cases.

Figure 3:
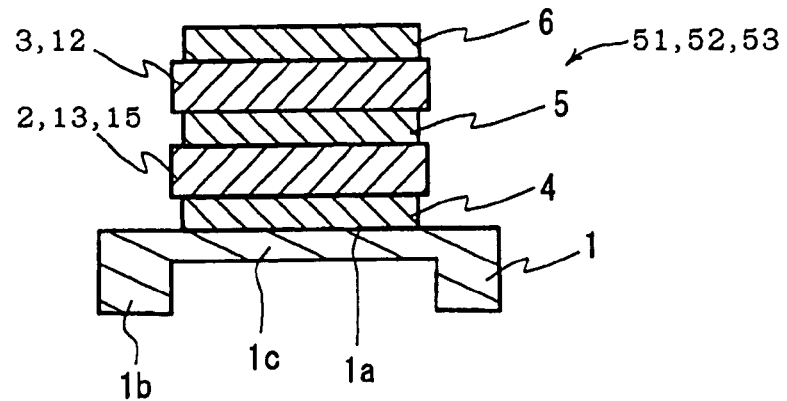
FIG. 3 is a sectional view schematically showing still other embodiment of the piezoelectric/electrostrictive film device of the present invention.

Next, the embodiment of the first piezoelectric/electrostrictive film device of the present invention is specifically described with referring to FIG. 1 and FIG. 3. As shown in FIG. 1, the first piezoelectric/electrostrictive film device 51 of the present embodiment comprises a substrate 1 made of a ceramic, a piezoelectric/electrostrictive portion 2 and electrode layers 4 and 5 electrically connected to the piezoelectric/electrostrictive portion 2, wherein the piezoelectric/electrostrictive portion 2 is solidly bonded to the substrate 1 via the electrode layer 4. Incidentally, the piezoelectric/electrostrictive portion may be solidly bonded to the substrate directly and not via the electrode layer.

The piezoelectric/electrostrictive portion 2 of the first piezoelectric/electrostrictive film device 51 of the present embodiment is made of crystal grains constituted by the above-mentioned first piezoelectric/electrostrictive ceramic composition, i.e. a piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$. As described above, since the first piezoelectric/electrostrictive ceramic composition contains Ni in a given proportion in terms of NiO, the piezoelectric/electrostrictive portion 2 made of crystal grains constituted by the composition and, specifically, by, for example, firing of the composition, is very low in proportion of heterogeneous phase and high in proportion of the perovskite phase contributing to electric field-induced strain and is dense and extremely high in piezoelectric/electrostrictive property.

Further, since the first piezoelectric/electrostrictive ceramic composition contains Si in a given proportion in terms of $SiO_2$, the piezoelectric/electrostrictive portion 2 made of crystal grains formed by firing of the composition is denser and is constituted by crystal grains having uniform particle diameters. Therefore, the first piezoelectric/electrostrictive film device 51 of the present embodiment comprising such a piezoelectric/electrostrictive portion 2 has an excellent piezoelectric/electrostrictive property and durability even under high-temperature and highly humid conditions.

In the piezoelectric/electrostrictive portion 2 of the first piezoelectric/electrostrictive film device 51 of the present embodiment, the crystal grains constituting the portion have an average particle diameter of preferably 0.5 to 5 μm, more preferably 1 to 4 μm, particularly preferably 1.3 to 3.7 μm. When the average particle diameter is less than 0.5 μm, domains may not develop sufficiently in the piezoelectric/electrostrictive portion 2; as a result, there arise, in some cases, a reduction in flexural displacement and a reduction in linearity of flexural displacement to electric field in high electric field region. Meanwhile, when the average particle diameter is more than 5 μm, domains develop sufficiently in the piezoelectric/electrostrictive portion 2; however, the movement of large domains is insufficient, giving a small flexural displacement in some cases.

As shown in FIG. 3, the first piezoelectric/electrostrictive film device 51 of the present embodiment may preferably have such a multi-layered body that a plural number of piezoelectric/electrostrictive portions 2 and 3 and electrodes 4, 5 and 6 are provided, and the plurality of the piezoelectric/electrostrictive portions 2 and 3 and the plurality of the electrodes 4, 5 and 6 are laminated alternately by sandwiching them each other, because, with such a body, a large flexural displacement can be obtained at a low voltage.

In the first piezoelectric/electrostrictive film device 51 of the present embodiment (see FIG. 1), the piezoelectric/electrostrictive portion 2 has a thickness of preferably 0.5 to 50 μm, more preferably 0.8 to 40 μm, particularly preferably 1.0 to 30 μm. When the thickness of the piezoelectric/electrostrictive portion 2 is less than 0.5 μm, even the piezoelectric/electrostrictive portion made of the first piezoelectric/electrostrictive ceramic composition may have an insufficient density. Meanwhile, when the thickness of the piezoelectric/electrostrictive portion 2 is more than 50 μm, the substrate 1 need be thicker for prevention of its breakage, which may make difficult the obtainment of a compact device. Incidentally, in the first piezoelectric/electrostrictive film device 51 having a multi-layered body such as shown in FIG. 3, the thickness of the piezoelectric/electrostrictive portions 2 and 3 means the respective thicknesses of the piezoelectric/electrostrictive portions 2 and 3.

Next, the embodiment of the second piezoelectric/electrostrictive film device of the present invention is specifically described with referring to FIG. 1 and FIG. 3. As shown in FIG. 1, the second piezoelectric/electrostrictive film device 52 of the present embodiment comprises a substrate 1 made of a ceramic, a piezoelectric/electrostrictive portion 2 and electrode layers 4 and 5 electrically connected to the piezoelectric/electrostrictive portion 2, wherein the piezoelectric/electrostrictive portion 2 is solidly bonded to the substrate 1 via the electrode layer 4. Incidentally, the piezoelectric/electrostrictive portion may be solidly bonded to the substrate directly and not via the electrode layer.

The piezoelectric/electrostrictive portion 2 of the second piezoelectric/electrostrictive film device 52 of the present embodiment is made of crystal grains constituted by the above-mentioned second piezoelectric/electrostrictive ceramic composition, i.e. a piezoelectric/electrostrictive ceramic composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$. As described above, since the second piezoelectric/electrostrictive ceramic composition contains, as a major component, a $Pb(Mg,Ni)_{1/3}Nb_{2/3}O_3$—$PbTiO_3$—$PbZrO_3$ ternary solid solution system composition wherein part of Mg is substituted with Ni, the piezoelectric/electrostrictive portion 2 made of crystal grains constituted by the composition and, specifically, by, for example, firing of the composition, is very low in proportion of heterogeneous phase and high in proportion of the perovskite phase contributing to electric field-induced strain and is dense and extremely high in piezoelectric/electrostrictive property.

Further, since the second piezoelectric/electrostrictive ceramic composition contains Si in a given proportion in terms of $SiO_2$, the piezoelectric/electrostrictive portion 2 made of crystal grains formed by firing of the composition is denser and is constituted by crystal grains having uniform particle diameters. Therefore, the second piezoelectric/electrostrictive film device 52 of the present embodiment comprising such a piezoelectric/electrostrictive portion 2 has an excellent piezoelectric/electrostrictive property and durability even under high-temperature and highly humid conditions.

In the piezoelectric/electrostrictive portion 2 of the second piezoelectric/electrostrictive film device 52 of the present embodiment, the crystal grains constituting the portion have an average particle diameter of preferably 0.5 to 5 μm, more preferably 1 to 4 μm, particularly preferably 1.3 to 3.7 μm. When the average particle diameter is less than 0.5 μm, domains may not develop sufficiently in the piezoelectric/electrostrictive portion 2; as a result, there arise, in some cases, a reduction in flexural displacement and a reduction in linearity of flexural displacement to electric field in high electric field region. Meanwhile, when the average particle diameter is more than 5 μm, domains develop sufficiently in the piezoelectric/electrostrictive portion 2; however, the movement of large domains is insufficient, giving a small flexural displacement in some cases.

As shown in FIG. 3, the second piezoelectric/electrostrictive film device 52 of the present embodiment may preferably have such a multi-layered body that a plural number of piezoelectric/electrostrictive portions 2 and 3 and electrode layers 4, 5 and 6 are provided, and the plurality of the piezoelectric/electrostrictive portions 2 and 3 and the plurality of the electrode layers 4, 5 and 6 are laminated alternately by sandwiching them each other, because, with such a body, a large flexural displacement can be obtained at a low voltage.

In the second piezoelectric/electrostrictive film device 52 of the present embodiment (see FIG. 1), the piezoelectric/electrostrictive portion 2 has a thickness of preferably 0.5 to 50 μm, more preferably 0.8 to 40 μm, particularly preferably 1.0 to 30 μm. When the thickness of the piezoelectric/electrostrictive portion 2 is less than 0.5 μm, even the piezoelectric/electrostrictive portion made of the second piezoelectric/electrostrictive ceramic composition may have an insufficient density. Meanwhile, when the thickness of the piezoelectric/electrostrictive portion 2 is more than 50 μm, the substrate 1 need be thicker for prevention of its breakage, which may make difficult the obtainment of a compact device. Incidentally, in the second piezoelectric/electrostrictive film device 52 having a multi-layered body such as shown in FIG. 3, the thickness of the piezoelectric/electrostrictive portions 2 and 3 means the respective thicknesses of the piezoelectric/electrostrictive portions 2 and 3.

Next, the embodiment of the third piezoelectric/electrostrictive film device of the present invention is specifically described with referring to FIG. 3. As shown in FIG. 3, the third piezoelectric/electrostrictive film device 53 of the present embodiment comprises a substrate 1 made of a ceramic, a plurality of piezoelectric/electrostrictive portions 2 and 3, and a plurality of electrode layers 4, 5 and 6 electrically connected to the piezoelectric/electrostrictive portions 2 and 3. The piezoelectric/electrostrictive portions 2 and 3 and the electrodes 4, 5 and 6 are laminated alternately on the substrate 1 and the lowermost piezoelectric/electrostrictive portion 15 of the piezoelectric/electrostrictive portions 2 and 3 is solidly bonded to the substrate 1 via the lowermost electrode layer 4 of the electrode layers 4, 5 and 6. Incidentally, the lowermost piezoelectric/electrostrictive portion may be solidly bonded to the substrate directly and not via the electrode layer.

In the third piezoelectric/electrostrictive film device 53 of the present embodiment, at least one piezoelectric/electrostrictive portion (for example, the first piezoelectric/electrostrictive portion 12) of the plurality of the piezoelectric/electrostrictive portions 2 and 3 is constituted by the first piezoelectric/electrostrictive ceramic composition. Therefore, as in the above-mentioned first piezoelectric/electrostrictive film device, the first piezoelectric/electrostrictive portion 12 made of crystal grains constituted by the first piezoelectric/electrostrictive ceramic composition is very low in content of heterogeneous phase and high in proportion of the perovskite phase contributing to electric field-induced strain, is dense, and has an extremely high piezoelectric/electrostrictive property. Further, since the first piezoelectric/electrostrictive portion 12 is denser and is constituted by crystal grains having uniform particle diameters, the third piezoelectric/electrostrictive film device 53 of the present embodiment comprising such a first piezoelectric/electrostrictive portion 12 has an excellent piezoelectric/electrostrictive property and durability even under high-temperature and highly humid conditions.

In the third piezoelectric/electrostrictive film device 53 of the present embodiment, at least one piezoelectric/electrostrictive portion of the plurality of the piezoelectric/electrostrictive portions 2 and 3, specifically, the piezoelectric/electrostrictive portion (for example, the second piezoelectric/electrostrictive portion 13) other than the first piezoelectric/electrostrictive 12 is constituted by the second piezoelectric/electrostrictive ceramic composition. Therefore, as in the above-mentioned second piezoelectric/electrostrictive film device, the second piezoelectric/electrostrictive portion 13 made of crystal grains constituted by the second piezoelectric/electrostrictive ceramic composition is very low in content of heterogeneous phase and high in proportion of the perovskite phase contributing to electric field-induced strain, is dense, and has an extremely high piezoelectric/electrostrictive property. Further, since the second piezoelectric/electrostrictive portion 13 is denser and is constituted by crystal grains having uniform particle diameters, the third piezoelectric/electrostrictive film device 53 of the present embodiment comprising such a second piezoelectric/electrostrictive portion 13 has an excellent piezoelectric/electrostrictive property and durability even under high-temperature and highly humid conditions.

In FIG. 3, the second piezoelectric/electrostrictive portion 13 is shown at a lower position (close to the substrate 1) and the first piezoelectric/electrostrictive portion 12 is shown at an upper position. However, the layer lamination sequence of the third piezoelectric/electrostrictive film device of the present invention is not restricted to such a lamination sequence. That is, the second piezoelectric/electrostrictive portion may be at a lower position close to the substrate 1 and the first piezoelectric/electrostrictive portion may be at an upper position. However, it is preferred for higher piezoelectric property that the second piezoelectric/electrostrictive portion 13 is at a lower position and the first piezoelectric/electrostrictive portion 12 is at an upper position. It is further preferred for the same reason to employ three or more piezoelectric/electrostrictive portions each made of a different piezoelectric/electrostrictive ceramic composition.

In the third piezoelectric/electrostrictive film device 53, the piezoelectric/electrostrictive portions 2 and 3 each have a thickness of preferably 0.5 to 50 µm, more preferably 0.8 to 40 µm, particularly preferably 1.0 to 30 µm. When the thicknesses of the piezoelectric/electrostrictive portions 2 and 3 are each less than 0.5 µm, even the piezoelectric/electrostrictive portion made of the first piezoelectric/electrostrictive ceramic composition or the second piezoelectric/electrostrictive ceramic composition may have an insufficient density. Meanwhile, when the thicknesses of the piezoelectric/electrostrictive portions 2 and 3 are each more than 50 µm, the substrate 1 need be thicker for prevention of its breakage, which may make difficult the obtainment of a compact device.

In the third piezoelectric/electrostrictive film device 53, the Ni content in terms of NiO, of the piezoelectric/electrostrictive ceramic composition constituting the lowermost piezoelectric/electrostrictive portion 15 is preferred to be smaller than the Ni content in terms of NiO, of the piezoelectric/electrostrictive ceramic composition constituting the piezoelectric/electrostrictive portion (for example, the first piezoelectric/electrostrictive portion 12) other than the lowermost piezoelectric/electrostrictive portion 15. Thereby, the lowermost piezoelectric/electrostrictive portion 15 is allowed to be very low in content of heterogeneous phase and high in proportion of the perovskite phase contributing to flexural displacement; therefore, the portion 15 can have an improved piezoelectric property owing to the properties of the composition per se. Further, the first piezoelectric/electrostrictive portion 12 of higher Ni content and the upper piezoelectric/electrostrictive portion laminated thereon (not shown in FIG. 3) are hardly restrained by the substrate 1 with respect to the contraction when fired and, in these portions, the effect of Ni addition appears strikingly. Therefore, the first piezoelectric/electrostrictive portion 12 and the upper piezoelectric/electrostrictive portion laminated thereon are made highly dense by the heat treatment in production process, which densifies even the neighboring lowermost piezoelectric/electrostrictive portion 15. This, together with the properties of the piezoelectric/electrostrictive ceramic compositions used, makes it possible to obtain a piezoelectric/electrostrictive film device having a higher piezoelectric/electrostrictive property.

In order for the third piezoelectric/electrostrictive film device 53 to become denser and even lower in content of heterogeneous phase, the Ni content in terms of NiO, of the piezoelectric/electrostrictive ceramic composition constituting the first piezoelectric/electrostrictive portion 12 is preferably 0.10 to 2.5% by mass, more preferably 0.15 to 2.0% by mass. Further, the ratio (lowermost/first ratio) of the Ni content (in terms of NiO) of the lowermost piezoelectric/electrostrictive portion 15 and the Ni content (in terms of NiO) of the first piezoelectric/electrostrictive portion 12 is preferably 0.07 to 0.35, more preferably 0.10 to 0.33, particularly preferably 0.12 to 0.30. When the lowermost/first ratio is less than 0.07, the first piezoelectric/electrostrictive portion 12 tends to be higher in content of heterogeneous phase, which may result in a reduced overall piezoelectric property. Meanwhile, when the lowermost/first ratio is more than 0.35, the first piezoelectric/electrostrictive portion 12 is low in densification; as a result, the densification of the lowermost piezoelectric/electrostrictive portion 15 is difficult and the overall piezoelectric property may be low. Incidentally, also when there are formed three or more piezoelectric/electrostrictive portions, the lowermost/first ratio is preferred to be in the above-mentioned range. In order to further promote the densification of each piezoelectric/electrostrictive portion, it is preferred that the Ni content (in terms of NiO) of the piezoelectric/electrostrictive portion laminated on the first piezoelectric/electrostrictive portion is equal to or higher than that of the lowermost piezoelectric/electrostrictive portion.

The substrate which is a constituent of the piezoelectric/electrostrictive film device of the present invention, is made of a ceramic; however, as to the kind of this ceramic, there is no particular restriction. However, from the standpoints of heat resistance, chemical stability and insulation, there is preferred a ceramic containing at least one member selected from the group consisting of stabilized zirconium oxide, aluminum oxide, magnesium oxide, mullite, aluminum nitride, silicon nitride and glass. Of these, stabilized zirconium oxide is particularly preferred because it has a high mechanical strength and excellent tenacity. Incidentally, in the present invention, the term "stabilized zirconium oxide" means a zirconium oxide wherein the phase transfer of crystals has been suppressed by addition of a stabilizer, and includes stabilized zirconium oxide and partially stabilized zirconium oxide.

As stabilized zirconium oxide, there can be mentioned those containing a stabilizer such as calcium oxide, magnesium oxide, yttrium oxide, scandium oxide, ytterbium oxide, cerium oxide, rare earth metal oxide or the like, in an amount of 1 to 30 mole %. One containing yttrium oxide as a stabilizer is preferred because such a material can give a diaphragm portion having a very high mechanical strength. In this case, the content of yttrium oxide is preferably 1.5 to 6 mole %, more preferably 2 to 4 mole %. Also preferred is one containing aluminum oxide in an amount of 0.1 to 5 mole %. The crystal phase of stabilized zirconium oxide may be a mixed phase of cubic system and monoclinic system, a mixed phase of tetragonal system and monoclinic system, a mixed phase of cubic system, tetragonal system and monoclinic system, etc. A stabilized zirconium oxide containing, as a major crystal phase, a tetragonal system or a mixed phase of tetragonal system and cubic system is preferred from the standpoints of strength, tenacity and durability.

The thickness of the substrate is preferably 1 μm to 1 mm, more preferably 1.5 to 500 μm, particularly preferably 2 to 200 μm. A substrate thickness of less than 1 μm may give a piezoelectric/electrostrictive film device of low mechanical strength. With a substrate thickness of more than 1 mm, the rigidity of substrate is large relative to the contraction stress generating in piezoelectric/electrostrictive portion when a voltage is applied thereto, which may make small the flexural displacement of piezoelectric/electrostrictive portion.

Figure 2:
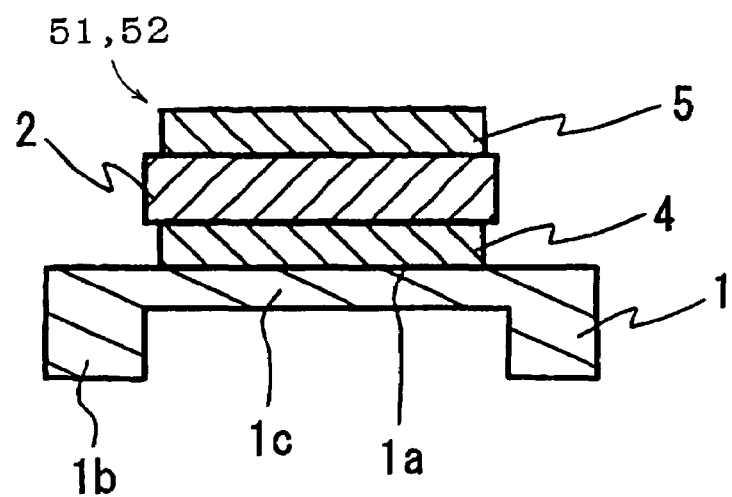
FIG. 2 is a sectional view schematically showing other embodiment of the piezoelectric/electrostrictive film device of the present invention.
Figure 4:
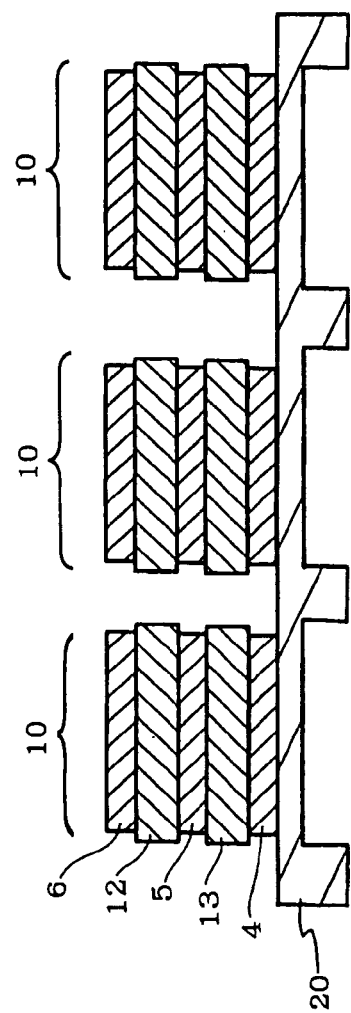
FIG. 4 is a sectional view schematically showing still other embodiment of the piezoelectric/electrostrictive film device of the present invention.

However, the substrate 1 may have such a shape as shown in FIG. 2, wherein the substrate 1 has a thin portion 1c having the above-mentioned thickness and having, at one side, a surface 1a to which an electrode or a piezoelectric/electrostrictive portion is to be bonded solidly, and a thick portion 1b having a thickness larger than the thin portion 1c, formed at a portion other than the portion corresponding to the surface 1a. Incidentally, an electrode layer 4 (or a piezoelectric/electrostrictive portion) is formed at a region approximately corresponding to the surface 1a. The substrate 1 having such a shape can give a piezoelectric/electrostrictive film device sufficiently high in flexural displacement and large in mechanical strength. It is also possible to use such a common substrate 20 as shown in FIG. 4, which is a continuity of a plurality of FIG. 2 substrates 1, and place, on this common substrate 20, a plurality of piezoelectric/electrostrictive film device units 10 each comprising a first piezoelectric/electrostrictive portion 12, a second piezoelectric/electrostrictive portion 13, and electrode layers 4, 5 and 6.

As to the surface shape of the substrate in the piezoelectric/electrostrictive film device of the present invention (in FIG. 1, the shape of the substrate surface to which an electrode layer 4 has been bonded solidly), there is no particular restriction. As the surface shape, there can be mentioned, for example, a rectangle, a square, a triangle, an eclipse, a true circle, a square having rounded corners, a rectangle having rounded corners, and combinations thereof. There is no particular restriction, either, as to the total shape of the substrate. It may be a capsule shape having an appropriate space inside.

Figure 7:
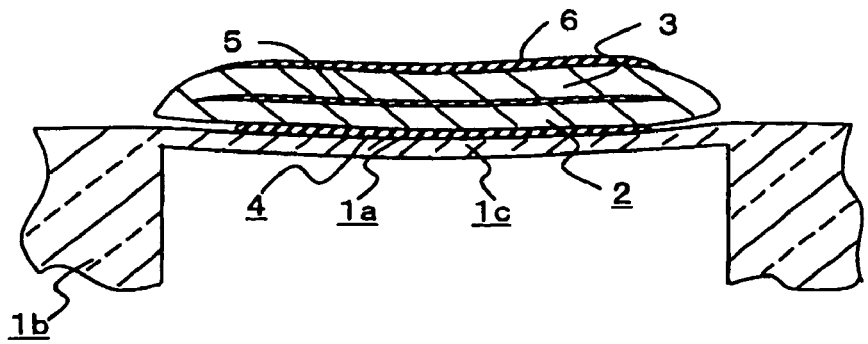
FIG. 7 is a sectional view showing other more specific example of the embodiment shown in FIG. 3.
Figure 8:
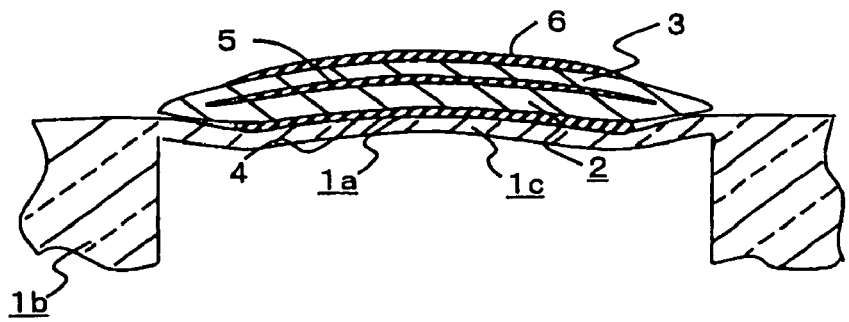
FIG. 8 is a sectional view showing still other more specific example of the embodiment shown in FIG. 3.

The shape of the thin portion of the substrate is preferred to be, for example, one such as shown in FIG. 7, wherein the central part of the portion is flexed toward a substrate side opposite to its side on which piezoelectric/electrostrictive portions 2 and 3 are to be formed, or a W shape such as shown in FIG. 8, which has a sectional shape having the concave portion at the center and two concave portions at the vicinity of the both ends of the substrate in the thickness direction of the substrate, because with such a thin portion shape, the linearity of flexural displacement to electric field is high. Incidentally, the flexed shape shown in FIG. 7 can be formed by utilizing the contraction of piezoelectric/electrostrictive portions 2 and 3 in their heat treatment step, and the W shape shown in FIG. 8 can be formed by adjusting the starting timing of firing contraction of piezoelectric/electrostrictive portions 2 and 3, the amount of firing contraction of the two portions, and the shape of thin portion 1c.

In the piezoelectric/electrostrictive film device of the present invention, the electrode layers are electrically connected to the piezoelectric/electrostrictive portion(s), and each electrode layer is provided beneath or on a piezoelectric/electrostrictive portion, or between adjacent two piezoelectric/electrostrictive portions. By thus providing the electrode layers, the electrode layers can function as a barrier to Ni transfer particularly when the Ni content (in terms of NiO) in the piezoelectric/electrostrictive ceramic composition constituting the piezoelectric/electrostrictive portion positioned above the lowermost piezoelectric/electrostrictive portion is equal to or higher than the Ni content (in terms of NiO) of the piezoelectric/electrostrictive ceramic composition constituting the lowermost piezoelectric/electrostrictive portion, and there can be effectively prevented the transfer of Ni from the piezoelectric/electrostrictive portion of higher Ni content (in terms of NiO) to the lowermost piezoelectric/electrostrictive portion of lower Ni content (in terms of NiO) and subsequent formation of heterogeneous phase.

Thus, in the piezoelectric/electrostrictive film device of the present invention, the electrode layers are preferred to be provided in such a state that the layers include the region(s) of piezoelectric/electrostrictive portion substantially contributing to flexural displacement, etc. For example, as shown in FIG. 3, each of electrode layers 4, 5 and 6 is preferred to be provided in such a state that the layers include the region(s) each surface portion of first and second piezoelectric/electrostrictive portions 12 and 13, including each surface center and occupying at least 80% of the surface area.

Figure 5A:
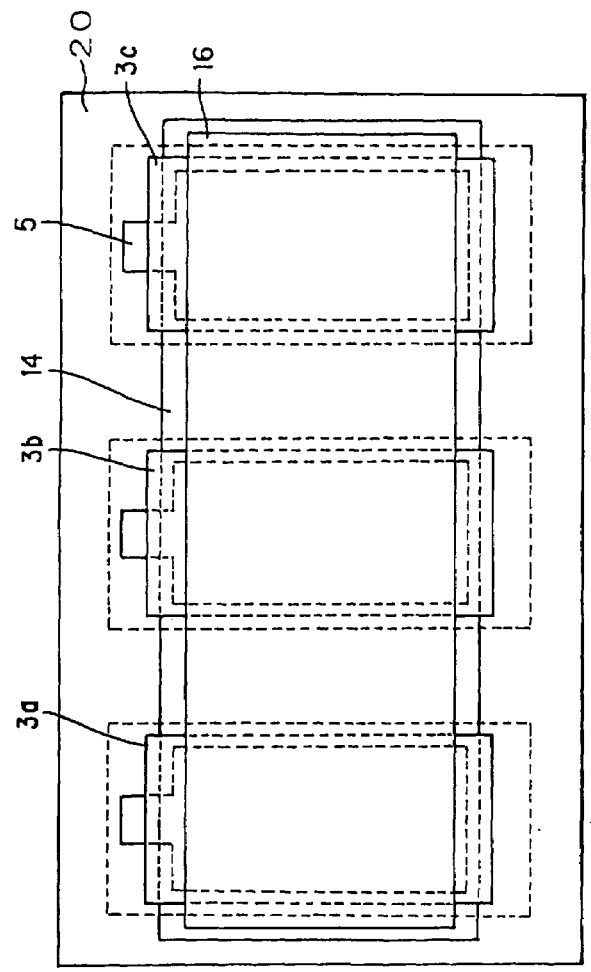
FIG. 5($a$) is a top view schematically showing still other embodiment of the piezoelectric/electrostrictive film device of the present invention.
Figure 5B:
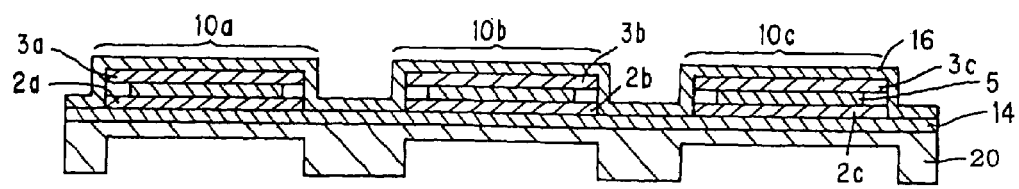

As shown in FIG. 5(a) and FIG. 5(b), when there is used a common substrate 20 between a plurality of piezoelectric/electrostrictive film device units 10a to 10c, the lowermost electrode layers 14 and the uppermost electrode layers 16 may be made respectively common between the piezoelectric/electrostrictive film device units 10a to 10c and there may be formed an integrated electrode layer 14 correspondingly to the piezoelectric/electrostrictive portions 2a to 2c and 3a to 3c. Such an integrated electrode layer 14 need not have a shape corresponding to the individual piezoelectric/ electrostrictive portions 2a to 2c and 3a to 3c, making easy the registration in electrode layer formation.

Figure 6:
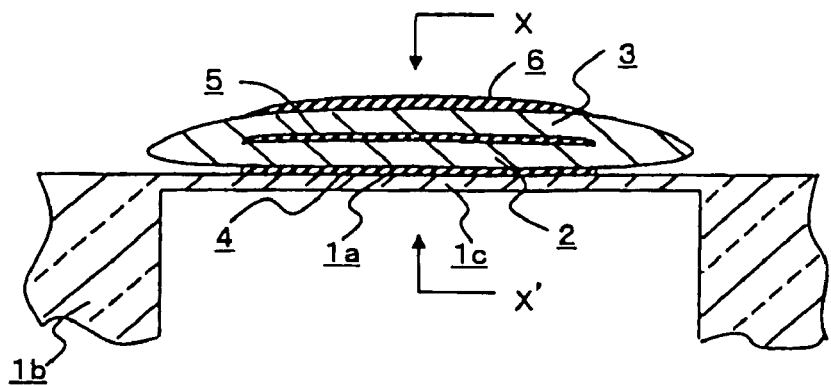
FIG. 6 is a sectional view showing a more specific example of the embodiment shown in FIG. 3.
Figure 12A:
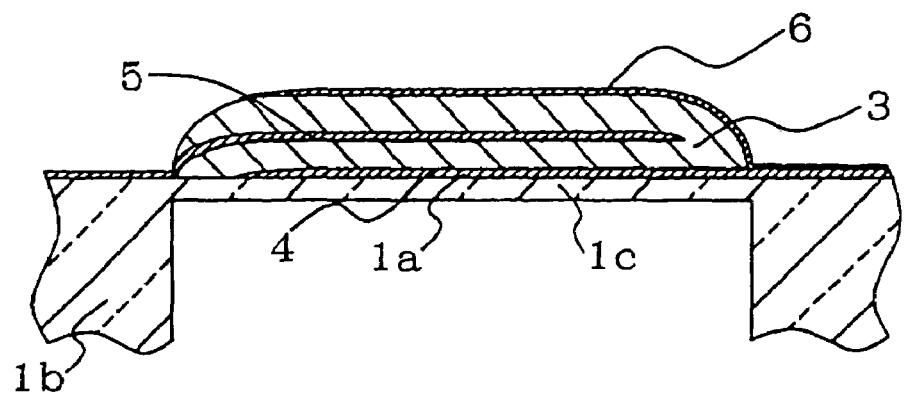
FIG. 12($a$) is a X–X' sectional view of the embodiment shown in FIG. 6.
Figure 12B:
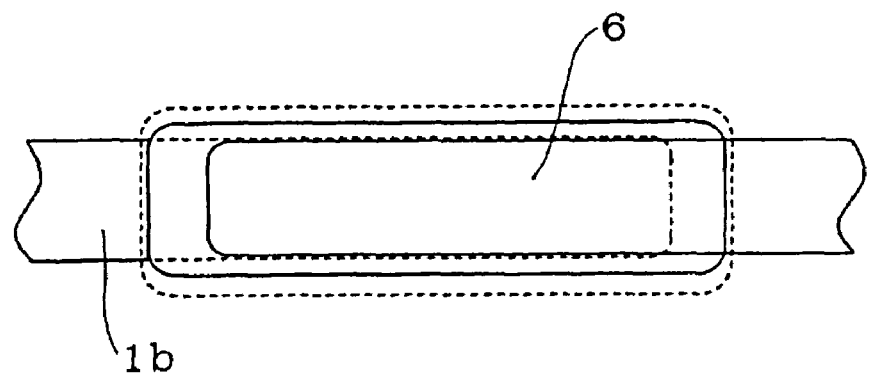

In the piezoelectric/electrostrictive film device of the present invention, there can be mentioned, as the material of the electrode layer, at least one kind of metal selected from the group consisting of platinum, palladium, rhodium, gold, silver and alloys thereof. Of these, platinum or an alloy containing platinum as a major component is preferred because they can show high heat resistance when the piezoelectric/electrostrictive portion(s) is (are) heat-treated. As to the size of the electrode layer, there is no particular restriction. For example, as shown in FIG. 6 and FIGS. 12(a) and 12(b), it is preferable that electrode layers 4, 5 and 6 have the same size and are provided at the same positions each other in the direction of the thickness of the layers. It is preferable that the upper layer(s) is(are) provided so as to cover sufficiently the subsequent lower layer(s). By employing such an electrode layer constitution, the upper piezoelectric/electrostrictive portion can be strained more greatly than the lower piezoelectric/electrostrictive portion, whereby a higher bending efficiency can be obtained and a more effective flexural displacement can be exhibited.

Figure 9:
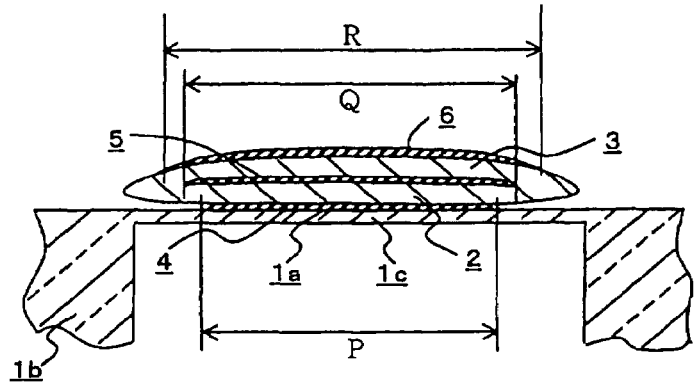
FIG. 9 is a sectional view showing still other more specific example of the embodiment shown in FIG. 3.
Figure 10:
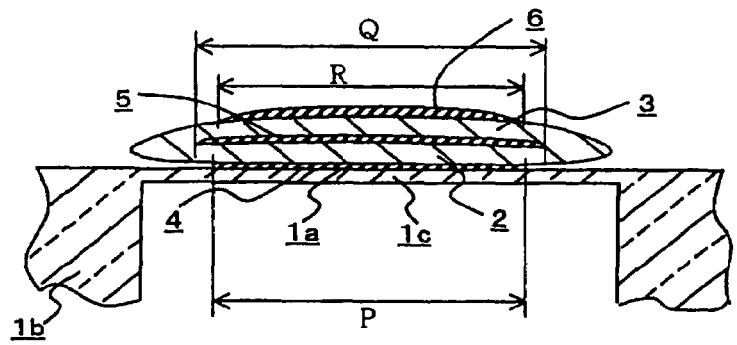
FIG. 10 is a sectional view showing still other more specific example of the embodiment shown in FIG. 3.
Figure 11:
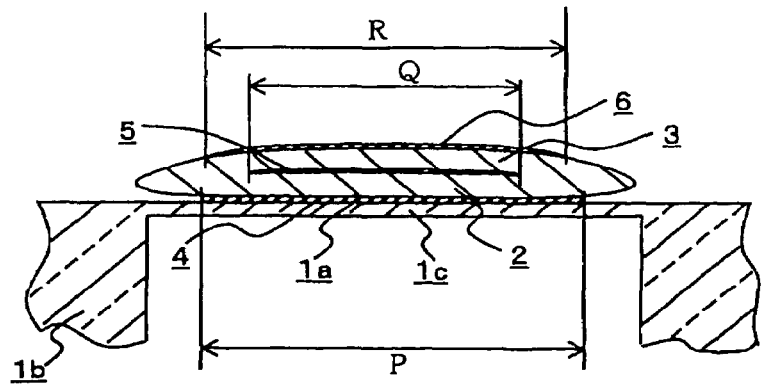
FIG. 11 is a sectional view showing still other more specific example of the embodiment shown in FIG. 3.

However, in the present invention, when the driving voltage of piezoelectric/electrostrictive film device is elevated in order to obtain a larger flexural displacement, it is preferred that, as shown in FIG. 10, an intermediate electrode layer 5 is provided in a larger range than lower and upper electrode layers 4 and 6, or, as shown in FIG. 11, an intermediate electrode layer 5 is provided in a smaller range than lower and upper electrode layers 4 and 6. By employing such an electrode layer constitution, substantially no electric field is applied to the vertical direction to the substrate ends which tend to have a smaller thickness in the vertical direction to the longitudinal axis of substrate of piezoelectric/electrostrictive portions 2 and 3 or their vicinities and the piezoelectric/electrostrictive portions 2 and 3 can be prevented from dielectric breakdown. When electrode layers are provided at the different positions each other in the direction of the thickness of the layers, the difference in positions is preferred to be optimized in view of the intended distribution of electric field. For example, between the electrode layers 4 and 5 (or 5 and 6) sandwiching the piezoelectric/electrostrictive portion 2 (or 3), the ratio of the areas in which these electrode layers are formed is preferably 0.5 to 2, more preferably 0.67 to 1.5, particularly preferably 0.83 to 1.2. Incidentally, in FIGS. 9 to 11, the symbol "P" means the width of lower electrode layer; the symbol "Q" means the width of intermediate electrode layer; and the symbol "R" means the width of upper electrode layer.

In the piezoelectric/electrostrictive film device of the present invention, the thickness of the electrode layer is preferably 15 μm or less, more preferably 5 μm or less. When the thickness is more than 15 μm, there are cases where electrode layers act as a buffer layer, resulting in a smaller flexural displacement. The thickness is at least 0.05 μm in order for the electrode layer to function as a substantial electrode.

Next, description is made on the method for preparing the piezoelectric/electrostrictive ceramic composition of the present invention. The piezoelectric/electrostrictive ceramic composition of the present invention can be prepared, for example, by mixing various raw materials corresponding to the composition, calcinating the resulting mixture, and grinding the calcinated material, or by calcinating the mixture, adding NiO to the calcinated material, and conducting calcination and grinding. Below is specifically described a representative case of preparing the first piezoelectric/electrostrictive ceramic composition of the present invention containing, as a major component, a $Pb(Mg_{1/3}Nb_{2/3})O_3$—$PbTiO_3$—$PbZrO_3$ ternary solid solution system composition.

First, there are mixed simple substances of Pb, Mg, Nb, Zr and Ti, or oxides of these elements (e.g., PbO, $Pb_3O_4$, MgO, $Nb_2O_5$, $TiO_2$ and $ZrO_2$), or carbonates of the elements (e.g. $MgCO_3$), or compounds (e.g. $MgNb_2O_6$ and $NiNb_2O_6$) containing several kinds of the elements so that the contents of the elements correspond to the formulation of intended piezoelectric/electrostrictive ceramic composition, to prepare a mixed raw material which becomes the major component of the intended piezoelectric/electrostrictive ceramic composition. The mixing can be conducted by an ordinary method and there can be mentioned, for example, a ball mill method. Specifically explained, required amounts of raw materials, balls and water are placed in a ball mill, and they are rotated for a predetermined time to prepare a mixture slurry. The water contained in the mixture slurry is removed, for example, by vaporization and drying or by filtration to obtain raw materials mixture.

The water and raw materials used contain a very small amount of Si (mostly $SiO_2$, etc.) in many cases. Since the content of Si is controlled at a very low level in the piezoelectric/electrostrictive ceramic composition of the present invention, it is preferred to appropriately select raw materials of high purity or purify them in order to prevent the presence of excessive Si in the composition, whereby the Si content in the piezoelectric/electrostrictive ceramic composition obtained finally can be controlled. For example, as to, in particular, lead oxides (PbO and $Pb_3O_4$) occupying about 65% by mass of the raw materials used, it is preferred to use lead oxides low in $SiO_2$ which is an impurity. Specifically, it is preferred to use lead oxides having a $SiO_2$ content of 10 ppm or less, particularly 5 ppm or less.

The silica source contained in the water used together with the raw materials include ionic silica, colloidal silica, particulate silica, etc. Therefore, it is preferred to use a water purified using a cation exchange resin, a filter or the like. Specifically, use of a water having a total silica content of 1 ppm or less, particularly 0.5 ppm or less is preferred. It is also preferred that raw materials and water all low in $SiO_2$ (impurity) content are used and, besides, Si is added to strictly control the content of Si at an extremely low level.

Then, the raw materials mixture is calcinated at 750 to 1,300° C.; thereafter, a required amount of NiO is added, followed by mixing; the resulting mixture is calcinated at 750 to 1,300° C.; thereby, a piezoelectric/electrostrictive ceramic composition can be obtained. The piezoelectric/electrostrictive ceramic composition, when measured for diffraction intensity by X-ray diffractometer, is preferred to show a ratio of the intensity of the most intense diffraction line of pyrochlore phase and the intensity of the most intense diffraction line of perovskite phase, of 5% or less, particularly 2% or less.

The piezoelectric/electrostrictive ceramic composition is ground using an ordinary grinder such as ball mill, attritor, beads mill or the like, to obtain a powder having desired particle diameters. The ground piezoelectric/electrostrictive ceramic composition has an average particle diameter of preferably 0.1 to 1.0 μm, more preferably 0.2 to 0.7 μm. Incidentally, the adjustment of the particle diameter may be conducted by heat-treating the ground piezoelectric/electrostrictive ceramic composition at 400 to 750° C. This heat treatment is preferred because finer particles integrate with other particles, giving a powder uniform in particle diameters and there can be obtained a piezoelectric/electrostrictive ceramic layer uniform in particle diameters. The preparation of the piezoelectric/electrostrictive ceramic composition may also be conducted, for example, by alkoxide method or co-precipitation method; and, in this preparation method as well, high-purity raw materials and water all low in Si content are preferred to be used.

In other preparation method for piezoelectric/electrostrictive ceramic composition, preparation of the composition is preferably made in the same manner as in the above-mentioned preparation of the first piezoelectric/electrostrictive ceramic composition, except that there are mixed simple substances of Pb, Mg, Ni, Nb, Zr and Ti, or oxides of these elements (e.g., PbO, $Pb_3O_4$, MgO, NiO, $Nb_2O_5$, $TiO_2$ and $ZrO_2$), or carbonates of the elements (e.g. $MgCO_3$), or compounds (e.g. $MgNb_2O_6$) containing several kinds of the elements so that the contents of the elements (Pb, Mg, Ni, Nb, Zr and Ti) correspond to the formulation of intended piezoelectric/electrostrictive ceramic composition and the resulting mixture is calcinated at once.

Next, description is made on the process for producing the piezoelectric/electrostrictive body of the present invention. First, the powdery piezoelectric/electrostrictive ceramic composition obtained by the above method is compacted at an appropriate pressure to convert into a desired size. The compact is heat-treated (fired) for 1 minute to 10 hours at 1,000 to 1,400° C., whereby a sintered body of desired shape can be obtained. Then, the sintered body is subjected to, for example, a cutting operation into an appropriate size and then to a poling treatment, whereby a piezoelectric/electrostrictive body (a bulk body) of the present invention can be obtained.

Next, description is made on the process for producing the piezoelectric/electrostrictive film device of the present invention. First, a piezoelectric/electrostrictive ceramic composition layer is formed on a substrate made of a ceramic or on an electrode layer formed on the substrate. As the method for forming the electrode layer, there can be mentioned, for example, methods by ion beam, sputtering, vacuum deposition, PVD, ion plating, CVD, plating, screen printing, spraying and dipping. Of these, a sputtering method or a screen printing method is preferred in view of the bondability of electrode layer to substrate and piezoelectric/electrostrictive portion. The formed electrode can be integrated with the substrate and/or the piezoelectric/electrostrictive portion by conducting a heat treatment at about 1,000 to 1,400%. This heat treatment may be conducted every time when one electrode layer has been formed, but may also be conducted together with the heat treatment conducted for a piezoelectric/electrostrictive ceramic composition layer formed.

As the method for forming the piezoelectric/electrostrictive ceramic composition layer on a substrate, there can be mentioned, for example, methods by ion beam, sputtering, vacuum deposition, PVD, ion plating, CVD, plating, sol gel, aerosol deposition, screen printing, spraying and dipping. Of these, a screen printing method is preferred because it can form a piezoelectric/electrostrictive ceramic composition layer easily and continuously in a shape and thickness of high precision. Then, on the piezoelectric/electrostrictive ceramic composition layer formed on a substrate is formed an electrode layer in the same manner as mentioned above. On this electrode layer are alternately formed a piezoelectric/electrostrictive ceramic composition layer and an electrode layer until desired numbers of piezoelectric/electrostrictive ceramic composition layers and electrode layers are obtained.

Then, the laminate obtained by alternately forming, on a substrate, a piezoelectric/electrostrictive ceramic composition layer and an electrode layer is heat-treated integrately. By this heat treatment, the piezoelectric/electrostrictive portion made of crystal grains constituted by a piezoelectric/electrostrictive ceramic composition can be bonded solidly to the substrate directly or via the electrode layer. Incidentally, this heat treatment need not be carried out for the laminate integrally and may be carried out orderly every time when one piezoelectric/electrostrictive ceramic composition layer has been formed; however, the heat treatment for the electrode-containing laminate integrally is preferred from the standpoint of productivity.

The temperature of the heat treatment is preferably 1,000 to 1,400° C., more preferably 1,100 to 1,350° C. At a temperature of less than 1,000° C., the solid bonding between substrate or electrode layer and piezoelectric/electrostrictive portion may be insufficient or the density of piezoelectric/electrostrictive portion may be insufficient. At a temperature of more than 1,400° C., the amount of vaporization of the Pb and Ni in piezoelectric/electrostrictive ceramic composition is large, which may make difficult the formation of a piezoelectric/electrostrictive portion having an intended composition. The duration (time) of highest temperature in the heat treatment is preferably 1 minute to 10 hours, more preferably 5 minutes to 4 hours. With a highest temperature duration of less than 1 minute, the densification of piezoelectric/electrostrictive portion tends to be insufficient and intended properties may be unobtainable. With a highest temperature duration of more than 10 hours, the total vaporization amount of Pb and Ni is large even when atmosphere control is made, which may incur problems such as reduced piezoelectric/electrostrictive property and increased frequency of dielectric breakdown.

In order to form a piezoelectric/electrostrictive portion having a Ni content controlled at a required level, it is preferred to conduct a heat treatment in a state that there is also present an atmosphere-controlling material having substantially the same Ni content as the piezoelectric/electrostrictive portion formed. Incidentally, the atmosphere-controlling material is preferred to have, also with respect to other components, substantially the same contents as the piezoelectric/electrostrictive portion formed, because this prevents the vaporization of other components from the piezoelectric/electrostrictive portion formed and enables reliable formation of a piezoelectric/electrostrictive portion having an intended composition.

Thereafter, a poling treatment is carried under appropriate conditions. The poling treatment may be preferably carried out by heating according to a known method. Incidentally, the temperature of heating is preferably 40 to 200° C. although it varies depending upon the Curie point of the piezoelectric/electrostrictive ceramic composition in the piezoelectric/electrostrictive portion formed.

EXAMPLES

The present invention is specifically described below by way of Examples. However, the present invention is in no way restricted to these Examples.

Piezoelectric/electrostrictive Ceramic Compositions (Examples 1 and 2, Comparative Examples 1 and 2)

Using raw materials and water each different in content of Si source (impurity), there were prepared four kinds of powders of piezoelectric/electrostrictive ceramic compositions different in Si content (Examples 1 and 2 and Comparative Examples 1 and 2), each containing, as a major component, a $Pb(Mg,Ni)_{1/3}Nb_{2/3})O_3$—$PbTiO_3$—$PbZrO_3$ ternary solid solution system composition represented by $Pb\{(Mg_{0.87}Ni_{0.13})_{1/3}Nb_{2/3}\}_{0.20}Ti_{0.43}Zr_{0.37}O_3$. Incidentally, the Si content in terms of $SiO_2$ as measured by inductively coupled plasma (ICP) spectrochemical analysis was 0.002% by mass (Comparative Example 1), 0.003% by mass (Example 1), 0.01% by mass (Example 2) and 0.02% by mass (Comparative Example 2).

Piezoelectric/electrostrictive Body (Examples 3 and 4, Comparative Examples 3 and 4))

The powders of piezoelectric/electrostrictive ceramic compositions of Examples 1 and 2 and Comparative Examples 1 and 2 were subjected to dry powder compression molding at a pressure of 0.5 t/cm² to obtain compacts each of 20 mm (diameter)×6 mm (thickness). Each compact was accommodated in a magnesia vessel and fired at 1,250° C. for 3 hours to obtain a sintered body. Each sintered body was processed into a size of 12 mm×3 mm×1 mm. A silver paste was coated on both sides of the sintered body, followed by baking (whereby electrodes were formed). The resulting body was dipped in a silicone oil of 70° C. and a DC voltage of 2 kV/mm was applied between the electrodes for 15 minutes to pole, whereby piezoelectric/electrostrictive body (Examples 3 and 4 and Comparative Examples 3 and 4) were obtained.

Each piezoelectric/electrostrictive body (or sintered body) obtained was measured for bulk density, average particle diameter of crystal grains and electric field-induced strain according to the following methods. Each body was further subjected to a driving test (A) under high-temperature and highly humid conditions. The results of these measurements or test are shown in Table 1.

[Bulk Density]
Measured for each sintered body by the Archimedes method.

[Average Particle Diameter of Crystal Grains]
A sintered body was subjected to mirror polishing and then to thermal etching at a temperature of about 1,000° C. so that grain boundaries could be seen clearly. Then, image processing was made. Thereafter, diameters of crystal grains were converted into diameters of circles having about the same areas as the grains, and the average of converted diameters was calculated and taken as average diameter (μm) of crystal grains.

Electric Field-induced Strain
A strain gauge was attached to electrodes; a voltage of 3 kV/mm was applied; and the amount of strain in a direction normal to the electric field generated was measured as electric field-induced strain (ppm). Incidentally, in Table 1, each strain was indicated as a relative value (%) when the electric field-induced strain of Example 3 was taken as 100%.

[Driving Test (A) Under High-Temperature and Highly Humid Conditions]
100 samples were prepared for each Example or Comparative Example. The samples were driven at a voltage of 0 to 2 kV at a frequency of 100 Hz under conditions of 40° C. (temperature) and 95% RH (humidity). Each sample was measured for electric field-induced strain at the initial timing (0 cycle) and after $10^8$ cycle and $10^9$ cycle driving. Then, there was counted the number of samples which gave, after $10^8$ and $10^9$ cycle driving, 90% or less of the initial electric field-induced strain.

TABLE 1

| | Si content (in terms of $SiO_2$) (mass %) | Average particle diameter (μm) | Bulk density (g/cm³) | Electric field-induced strain (%) | Driving test (A) Under high-temperature and highly humid conditions | |
|---|---|---|---|---|---|---|
| | | | | | $10^8$ cycles (number of samples) | $10^9$ cycles (number of samples) |
| Comp. Ex. 3 | 0.002 | 1.1 | 7.5 | 80 | 0 | 0 |
| Ex. 3 | 0.003 | 1.3 | 7.7 | 100 | 0 | 0 |
| Ex. 4 | 0.01 | 3.7 | 7.7 | 93 | 0 | 0 |
| Comp. Ex. 4 | 0.02 | 5.4 | 7.8 | 95 | 2 | 5 |

It is clear from Table 1 that, in comparison of the electric field-induced strains before the driving test under high-temperature and highly humid conditions, the piezoelectric properties of Examples 3 and 4 are high as compared with that of Comparative Example 3 and, in comparison of the electric field-induced strains after the driving test under high-temperature and highly humid conditions, Examples 3 and 4, as compared with Comparative Example 4, cause no such reduction in piezoelectric property that the electric field-induced strain after the test becomes 90% or less of the initial electric field-induced strain.

Piezoelectric/electrostrictive Film Devices
(Examples 5 and 6, Comparative Examples 5 and 6)

A platinum-made lower electrode of 1.2 mm×0.8 mm×3 μm (thickness) was formed by screen printing on a $Y_2O_3$-stabilized $ZrO_2$ substrate having a flat thin portion of 1.6 mm×1.1 mm×10 μm (thickness), followed by a heat treatment of 1,300° C. and 2 hours for integration of the substrate and the electrode. Then, thereon was laminated by screen printing, in a size of 1.3 mm×0.9 mm×10 μm (thickness), a piezoelectric/electrostrictive body made of a Piezoelectric/electrostrictive ceramic composition, of Example 1 or 2 or Comparative Example 1 or 2. On the laminated piezoelectric/electrostrictive body was laminated, by screen printing, a platinum-made intermediate electrode of 1.0 mm×1.1 mm×3 μm (thickness). On this intermediate electrode was laminated, by screen printing, the same piezoelectric/electrostrictive body [1.3 mm×0.9 mm×10 μm (thickness)] as used above. Then, a heat treatment of 1,275° C. and 2 hours was conducted in a vessel while an atmosphere-controlling material having the same composition as the piezoelectric/electrostrictive body used was allowed to be present in the vessel in an amount of 0.15 mg/cm³ (in terms of NiO) per unit volume of atmosphere. Each piezoelectric/electrostrictive portion formed had a thickness of 7 μm after the heat treatment. Lastly, on the uppermost piezoelectric/electrostrictive portion was formed, by screen printing, a gold-made upper electrode of 1.2 mm×0.8 mm×0.5 μm (thickness). Thereafter, a heat treatment was conducted to produce piezoelectric/electrostrictive film devices each having two piezoelectric/electrostrictive portions, of Examples 5 and 6 and Comparative Examples 5 and 6.

Each piezoelectric/electrostrictive film device obtained was measured for average particle diameter of crystal grains and flexural displacement according to the following methods. Each film device was further subjected to a driving test (B) under high-temperature and highly humid conditions. The results of these measurements or test are shown in Table 2.

[Average Particle Diameter of Crystal Grains]

The surface of the piezoelectric/electrostrictive portion after heat treatment was subjected to image processing. Thereafter, particle diameters of crystal grains were converted into diameters of circles having about the same areas as the grains, and the average of converted diameters was calculated and taken as average diameter (μm) of crystal grains.

[Flexural Displacement]

A voltage was applied between electrodes of piezoelectric/electrostrictive film device so as to generate an electric field of 3 kV/mm. The resulting flexural displacement (μm) was measured using a laser displacement tester. Incidentally, in Table 2, each flexural displacement was indicated as a relative value (%) when the flexural displacement of Example 5 was taken as 100%.

[Driving Test (B) Under High-temperature and Highly Humid Conditions]

100 samples were prepared for each Example or Comparative Example. The samples were driven at an applied electric field of 0 to 3 kV/mm at a frequency of 1 kHz under conditions of 40° C. (temperature) and 95% RH (humidity). Each sample was measured for flexural displacement at the initial timing (0 cycle) and after $10^8$ cycle and $10^9$ cycle driving. Then, there was counted the number of samples which gave, after $10^8$ and $10^9$ cycle driving, 90% or less of the initial flexural displacement.

TABLE 2

| | Si content (in terms of SiO₂) (mass %) | Average particle diameter (μm) | Flexural displacement (%) | Driving test (B) Under high-temperature and Highly humid conditions | |
|---|---|---|---|---|---|
| | | | | $10^8$ cycles (number of samples) | $10^9$ cycles (number of samples) |
| Comp. Ex. 5 | 0.002 | 0.8 | 73 | 0 | 1 |
| Ex. 5 | 0.003 | 1.1 | 100 | 0 | 0 |
| Ex. 6 | 0.01 | 3.4 | 95 | 0 | 0 |
| Comp. Ex. 6 | 0.02 | 5.2 | 96 | 2 | 4 |

It is clear from Table 2 that, in comparison of the flexural displacements before the driving test under high-temperature and highly humid conditions, the piezoelectric properties of Examples 5 and 6 are high as compared with that of Comparative Example 5 and, in comparison of the flexural displacements after the driving test under high-temperature and highly humid conditions, Examples 5 and 6, as compared with Comparative Example 6, cause no such reduction in piezoelectric property that the flexural displacement after the test becomes 90% or less of the initial flexural displacement.

The piezoelectric/electrostrictive body and piezoelectric/electrostrictive film device of the present invention have a piezoelectric/electrostrictive property and durability, are suitable for use in actuator, sensor, etc., and, even when used particularly under high-temperature and highly humid conditions, show excellent durability.

What is claimed is:

1. A piezoelectric/electrostrictive ceramic composition containing, as a major component, a $Pb(Mg_{1/3}Nb_{2/3})O_3$—$PbTiO_3$—$PbZrO_3$ ternary solid solution system composition and further containing Ni in an amount of 0.05 to 3.0% by mass in terms of NiO and Si in an amount of 0.003 to 0.01% by mass in terms of $SiO_2$, wherein the $Pb(Mg_{1/3}Nb_{2/3})O_3$—$PbTiO_3$—$PbZrO_3$ ternary solid solution system composition is presented by the following compositional formula(1):

$Pb_x(Mg_{y/3}Nb_{2/3})_aTi_bZr_cO_3$     (1):

wherein x is 0.95≦x≦1.05; y is 0.8≦y≦1.0; a, b and c are decimals defined by a range, in coordinates formed by three coordinate axes of a, b and c, a range of (a,b,c)=(0.550, 0.425, 0.025 ), (0.550, 0.325, 0.125), (0.375, 0.325, 0.300), (0.100, 0.425, 0.475), (0.100, 0.525. 0.375)and (0.375, 0.425, 0.200); and a+b+c =1.000.

2. A piezoelectric/electrostrictive ceramic composition containing, as a major component, a $Pb(Mg,Ni)_{1/3}Nb_{2/3}O_3$—$PbTiO_3$—$PbZrO_3$ ternary solid solution system composition and further containing Si in an amount of 0.003 to 0.01% by mass in terms of $SiO_2$, wherein the $Pb(Mg,Ni)_{1/3}Nb_{2/3}O_3$—$PbTiO_3$—$PbZrO_3$ ternary solid solution system composition is presented by the following compositional formula (2):

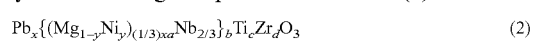

$Pb_x\{(Mg_{1-y}Ni_y)_{(1/3)xa}Nb_{2/3}\}_bTi_cZr_dO_3$     (2)

wherein x is 0.95≦x≦1.05; y is 0.05≦y≦0.20; a is 0.90≦a≦1.10; b, c and d are decimals defined by a range, in coordinates formed by three coordinate axes of b, c and d, a range of (b,c,d)=(0.550, 0.425, 0.025), (0.550, 0.325, 0.125), (0.375, 0.325, 0.300), (0.100, 0.425, 0.475), (0.100, 0.525, 0.375) and (0.375, 0.425, 0.200) and b+c+d=1.000.

3. A piezoelectric/electrostrictive body made of crystal grains constituted by a piezoelectric/electrostrictive ceramic composition set forth in claim 1.

4. A piezoelectric/electrostrictive body according to claim 3, wherein the crystal grains have an average particle diameter of 0.5 to 5 μm.

5. A piezoelectric/electrostrictive body made of crystal grains constituted by a piezoelectric/electrostrictive ceramic composition set forth in claim 2.

6. A piezoelectric/electrostrictive body according to claim 5, wherein the crystal grains have an average particle diameter of 0.5 to 5 μm.

7. A piezoelectric/electrostrictive film device comprising a substrate made of a ceramic, at least one piezoelectric/electrostrictive portion and a plural electrode layers electrically connected to the piezoelectric/electrostrictive portion, wherein said at least one piezoelectric/electrostrictive portion is solidly bonded to the substrate directly or via one of the electrode layers, characterized in that the piezoelectric/ electrostrictive portion is made of crystal grains constituted by a piezoelectric/electrostrictive ceramic composition set forth in claim 1.

8. A piezoelectric/electrostrictive film device according to claim 7, wherein the crystal grains have an average particle diameter of 0.5 to 5 μm.

9. A piezoelectric/electrostrictive film device according to claim 7, wherein a plural number of the piezoelectric/electrostrictive portions and the electrode layers are provided and a plurality of the piezoelectric/electrostrictive portions and a plurality of the electrode layers are laminated alternately by sandwiching them each other.

10. A piezoelectric/electrostrictive film device according to claim 7, wherein each piezoelectric/electrostrictive portion has a thickness of 0.5 to 50 μm.

11. A piezoelectric/electrostrictive film device comprising a substrate made of a ceramic, a piezoelectric/electrostrictive portion and electrode layers electrically connected to the piezoelectric/electrostrictive portion, wherein the piezoelectric/electrostrictive portion is solidly bonded to the substrate directly or via one of the electrode layers, characterized in that the piezoelectric/electrostrictive portion is made of crystal grains constituted by a piezoelectric/electrostrictive ceramic composition set forth in claim 2.

12. A piezoelectric/electrostrictive film device comprising a substrate made of a ceramic, a piezoelectric/electrostrictive portion and electrode layers electrically connected to the piezoelectric/electrostrictive portion, wherein the piezoelectric/electrostrictive portion is solidly bonded to the substrate directly or via one of the electrode layers, characterized in that the piezoelectric/electrostrictive portion is made of crystal grains constituted by a piezoelectric/electrostrictive ceramic composition set forth in claim 2.

13. A piezoelectric/electrostrictive film device according to claim 11, wherein the crystal grains have an average particle diameter of 0.5 to 5 μm.

14. A piezoelectric/electrostrictive film device according to claim 11, wherein a plural number of the piezoelectric/electrostrictive portions and the electrode layers are provided and a plurality of the piezoelectric/electrostrictive portions and a plurality of the electrode layers are laminated alternately by sandwiching them each other.

15. A piezoelectric/electrostrictive film device according to claim 13, wherein each piezoelectric/electrostrictive portion has a thickness of 0.5 to 50 μm.

16. A piezoelectric/electrostrictive film device comprising a substrate made of a ceramic, a plurality of piezoelectric/electrostrictive portions made of a piezoelectric/electrostrictive ceramic composition, and a plurality of electrode portions electrically connected to the piezoelectric/electrostrictive portions, wherein the piezoelectric/electrostrictive portions and the electrode layers are laminated alternately on the substrate and the lowermost piezoelectric/electrostrictive portion is solidly bonded to the substrate directly or via the lowermost electrode layer, characterized in that at least one piezoelectric/electrostrictive portion (first piezoelectric/electrostrictive portion) is constituted by a piezoelectric/electrostrictive ceramic composition set forth in claim 1 and at least one piezoelectric/electrostrictive portion (second piezoelectric/electrostrictive portion) other than the first piezoelectric/electrostrictive portion is constituted by a piezoelectric/electrostrictive ceramic composition set forth in claim 2.

17. A piezoelectric/electrostrictive film device according to claim 16, wherein the plurality of piezoelectric/electrostrictive portions have each a thickness of 0.5 to 50 μm.

18. A piezoelectric/electrostrictive film device according to claim 16, wherein a Ni content in terms of NiO, of the piezoelectric/electrostrictive ceramic composition constituting the lowermost piezoelectric/electrostrictive portion is smaller than the Ni content in terms of NiO, of the piezoelectric/electrostrictive ceramic composition constituting the piezoelectric/electrostrictive portion other than the lowermost piezoelectric/electrostrictive portion.

\* \* \* \* \*